(12) United States Patent
Helbig et al.

(10) Patent No.: US 10,383,209 B2
(45) Date of Patent: Aug. 13, 2019

(54) ELECTRONIC ASSEMBLY FOR LIGHTING APPLICATIONS, LIGHTING DEVICE AND METHOD FOR PRODUCING AN ELECTRONIC ASSEMBLY

(71) Applicant: Osram GmbH, Munich (DE)

(72) Inventors: Philipp Helbig, Heidenheim (DE); Sebastian Jooss, Dettingen (DE)

(73) Assignee: OSRAM GmbH., Munich (DE)

( * ) Notice: Subject to any disclaimer, the term of this patent is extended or adjusted under 35 U.S.C. 154(b) by 0 days.

(21) Appl. No.: 15/987,950

(22) Filed: May 24, 2018

(65) Prior Publication Data

US 2018/0343735 A1 Nov. 29, 2018

(30) Foreign Application Priority Data

May 29, 2017 (DE) .................. 10 2017 208 973

(51) Int. Cl.
*H05K 1/00* (2006.01)
*H05K 1/02* (2006.01)
(Continued)

(52) U.S. Cl.
CPC .......... *H05K 1/0201* (2013.01); *F21V 29/70* (2015.01); *H01L 23/3677* (2013.01); *H01L 23/49838* (2013.01); *H01L 25/0753* (2013.01); *H05K 1/0204* (2013.01); *H05K 1/145* (2013.01); *H05K 3/0061* (2013.01); *H05K 3/341* (2013.01); *F21Y 2115/10* (2016.08); *H01L 33/62* (2013.01);
(Continued)

(58) Field of Classification Search
CPC ........ F21V 29/508; F21V 29/89; F21V 29/80; F21V 29/86; F21V 29/70; H01L 23/3677; H01L 23/3735; H01L 33/642; H01L 23/49838; H01L 33/62; H01L 2224/48091; H01L 2924/19107; F21Y 2115/10; H05K 1/0201; H05K 1/0204; H05K 1/145; H05K 3/0061; H05K 3/341; H05K 1/0265; H05K 1/111; H05K 1/183
See application file for complete search history.

(56) References Cited

U.S. PATENT DOCUMENTS 8,154,037 B2 * 4/2012 Kadotani ................ F21V 29/74
257/712
8,860,196 B2 * 10/2014 Eom ................... H01L 23/3735
257/678
(Continued)

*Primary Examiner* — Pete T Lee

(57) ABSTRACT

An electronic assembly for lighting applications. The assembly includes a printed circuit board (PCB) having a first PCB surface, which is designed for populating with electronic components, and a second PCB surface opposite the first PCB surface. The PCB has a continuous cutout from the first PCB surface to the second PCB surface. The electronic assembly further includes a heat distributor having at least one first contact surface and at least one second contact surface opposite the first contact surface. The first contact surface is connected in a material-bonded manner to the PCB arranged in parallel therewith at the second printed circuit board surface. The electronic assembly further includes at least one first light emitting diode element, which is arranged on a section of the first contact surface, which section is exposed within the cutout, and is connected in a material-bonded manner to the first contact surface.

15 Claims, 6 Drawing Sheets

(51) Int. Cl.
*H01L 23/367* (2006.01)
*H01L 23/498* (2006.01)
*H05K 3/34* (2006.01)
*H05K 1/14* (2006.01)
*F21V 29/70* (2015.01)
*H05K 3/00* (2006.01)
*H01L 25/075* (2006.01)
*F21Y 115/10* (2016.01)
*H05K 1/11* (2006.01)
*H01L 33/62* (2010.01)
*H05K 1/18* (2006.01)
*H01L 33/64* (2010.01)

(52) U.S. Cl.
CPC .......... *H01L 33/641* (2013.01); *H01L 33/642* (2013.01); *H01L 2224/48091* (2013.01); *H01L 2924/19107* (2013.01); *H01L 2933/0075* (2013.01); *H05K 1/0265* (2013.01); *H05K 1/111* (2013.01); *H05K 1/183* (2013.01)

(56) References Cited

U.S. PATENT DOCUMENTS 8,926,145 B2 * 1/2015 Lynch ................. F21S 8/02
257/98
2014/0211436 A1 * 7/2014 Behringer ............ H05K 1/183
361/761

* cited by examiner

ELECTRONIC ASSEMBLY FOR LIGHTING APPLICATIONS, LIGHTING DEVICE AND METHOD FOR PRODUCING AN ELECTRONIC ASSEMBLY

CROSS-REFERENCE TO RELATED APPLICATION

This application claims priority to German Patent Application Serial No. 10 2017 208 973.3, which was filed May 29, 2017, and is incorporated herein by reference in its entirety.

TECHNICAL FIELD

Various embodiments relate generally to an electronic assembly for lighting applications, which includes a printed circuit board and at least one first light emitting diode element. The printed circuit board is designed for populating with electronic components on a first printed circuit board surface. Various embodiments furthermore relate to a lighting device having an electronic assembly of this kind. Various embodiments relate moreover to a method for producing an electronic assembly for lighting applications by providing a printed circuit board having a first printed circuit board surface, which is designed for populating with electronic components and/or which is populated with electronic components, and arranging at least one first light emitting diode element.

BACKGROUND

Modern lighting devices based on high-power light emitting diodes (LEDs) that are now available make it possible to design an LED light module in a compact and variable manner during formation thereof. At the same time, the demands on an efficient heat management concept are increasing, since precisely those heat losses arising in the case of high-power light emitting diodes arise in a concentrated space and have to be dissipated from the light emitting diodes, since otherwise premature aging and hence a reduction in the lifetime of the light emitting diodes results on account of excessive environmental temperatures of the light emitting diodes.

A currently conventional design of an electronic assembly 10, as is known internally, is illustrated in FIG. 1. Here, light emitting diodes are soldered onto a printed circuit board 11, usually based on FR4 carrier material, that is to say a composite material composed of epoxy resin and glass fiber fabric, onto a populating side of said printed circuit board.

Here, the presently illustrated case involves a first light emitting diode element 14, a second light emitting diode element 15 and a third light emitting diode element 16. The printed circuit board 11 includes a first printed circuit board surface 11a as populating side and a second printed circuit board surface 11b on the opposite side. In addition to the light emitting diode elements 14, 15, 16, there are therefore further electronic components (not shown in FIG. 1) populated on the top layer of the printed circuit board, which is specified by the first printed circuit board surface 11a.

Said further electronic components are soldered onto a first copper layer 12 on the top layer of the printed circuit board 11 as surface-mount components (surface-mount device, SMD). The copper layer 12 is designed here in such a way that the desired contact connections can be produced. For the case where routing of the circuit in a plane is not possible, an appropriate line network can be provided on the bottom layer of the printed circuit board 11 by means of a second copper layer 13, said line network electrically connecting conductor tracks arranged on the top layer of the printed circuit board 11 to one another. To this end, plated-through holes 17 (vias) are fixed in the printed circuit board 11, said plated-through holes producing an electrically conductive connection between the copper layer 12 on the top layer of the printed circuit board 11, that is to say on the first printed circuit board surface 11a, and the copper layer 13 on the second printed circuit board surface 11b, that is to say on the bottom layer of the printed circuit board 11.

The printed circuit board 11 is connected to a cooling body 19 via a layer of thermally conductive adhesive 18, said cooling body serving as a heatsink to dissipate the heat losses arising in the assembly 10 to the surroundings.

SUMMARY

An electronic assembly for lighting applications. The assembly includes a printed circuit board (PCB) having a first PCB surface, which is designed for populating with electronic components, and a second PCB surface opposite the first PCB surface. The PCB has a continuous cutout from the first PCB surface to the second PCB surface. The electronic assembly further includes a heat distributor having at least one first contact surface and at least one second contact surface opposite the first contact surface. The first contact surface is connected in a material-bonded manner to the PCB arranged in parallel therewith at the second printed circuit board surface. The electronic assembly further includes at least one first light emitting diode element, which is arranged on a section of the first contact surface, which section is exposed within the cutout, and is connected in a material-bonded manner to the first contact surface.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The features and combinations of features cited in the description above and the features and combinations of features cited in the description of the figures below and/or shown in the figures alone can be used not only in the respectively indicated combination but also in other combinations or on their own without departing from the scope of the invention. Therefore, embodiments that are not shown or explained explicitly in the figures, but emerge and are producible from the explained embodiments by virtue of separate combinations of features, can also be regarded as disclosed by the invention.

Figure 2:
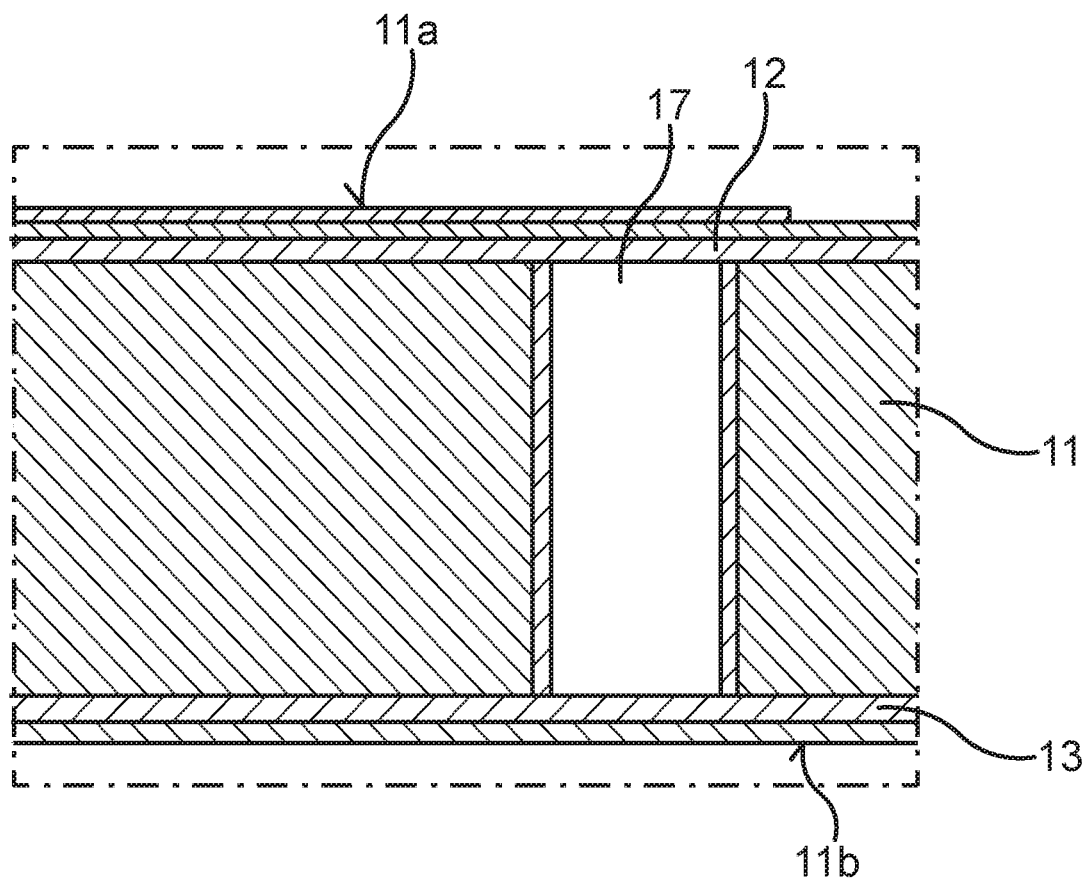
FIG. 2 shows a simplified schematic illustration of an enlarged detail view of a section from the illustration of FIG. 1.
Figure 3:
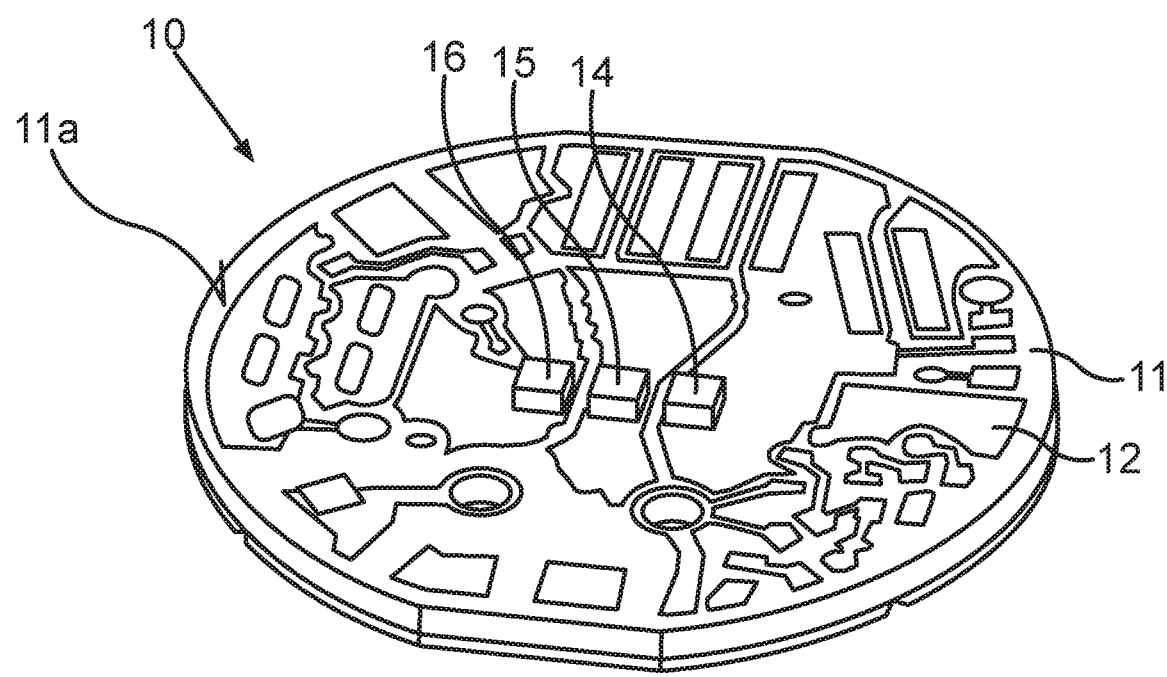
FIG. 3 shows a simplified schematic illustration of a perspective view of a printed circuit board from the electronic assembly as illustrated in FIG. 1.

FIG. 2 illustrates a partial section of the printed circuit board 11 having the plated-through hole 17 in more detail. Furthermore, FIG. 3 shows the printed circuit board 11 in an oblique view from above, in which it is possible to identify the copper layer 12, which has been divided into different networks, on the top layer 11a of the printed circuit board 11 and the light emitting diode elements 14, 15, 16 arranged by way of example on the populating side of the printed circuit board 11.

In addition to the plated-through holes 17 required for the production of the electrical connections, further plated-through holes 17 are used here, the function of which consists in dissipating heat from the first printed circuit board surface 11a, that is to say the top layer of the printed circuit board 11, to the second printed circuit board surface 11b, that is to say to the bottom layer of the printed circuit board 11 on account of the good thermal conductivity correlated to the good electrical conductivity of said plated-through holes. On the bottom layer of the printed circuit board 11, that is to say the second printed circuit board surface 11b, corresponding extensive regions can be formed in the copper layer 13. This configuration of the copper layer 13 on the bottom layer of the printed circuit boards can thus achieve the transport of heat in the lateral direction.

Figure 1:
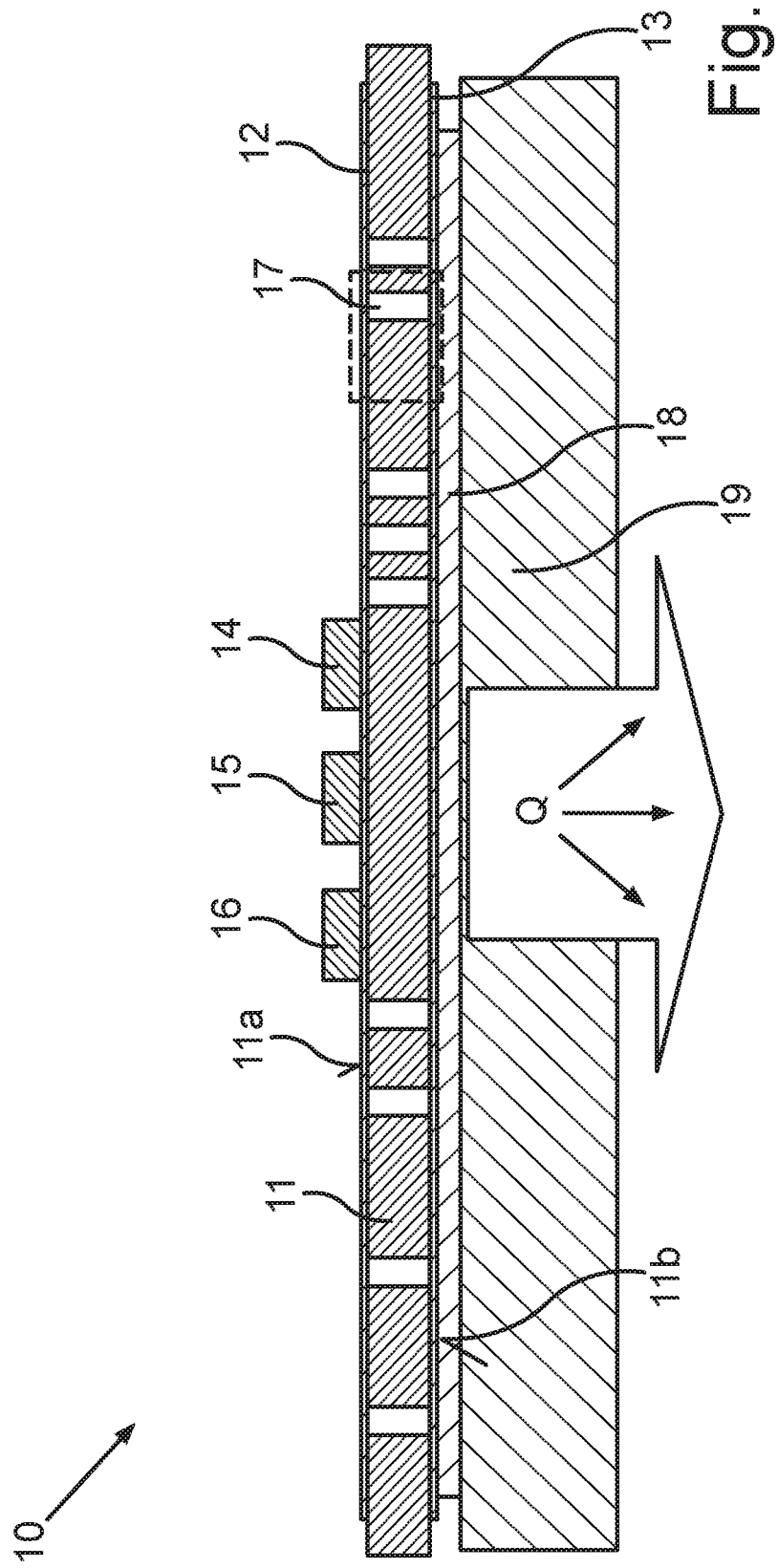
FIG. 1 shows a simplified schematic illustration of a cross-sectional view of an electronic assembly according to an internally known arrangement.

On the FR4 printed circuit board 11, which is partially populated with thermal vias 17 having a wall thickness of usually approximately 25 micrometers of copper, the light emitting diode elements 14, 15, 16 are adhesively bonded directly onto the copper layer 12 of the printed circuit board 11. This is also referred to as a chip-on-board process, COB for short. Due to this design, thermal spreading of the heat losses of the light emitting diode elements 14, 15, 16 is optimally possible to only a limited extent, since the thickness of the copper surface of a conventional, commercially available FR4 printed circuit board is typically only between 35 and 70 micrometers. The heating thus mainly takes place on the direct path through the printed circuit board 11 into the heatsink in the form of the cooling body 19; this is indicated schematically in FIG. 1 by the heat losses Q with direction arrows. In this case, pronounced and thermally advantageous spreading of the heat in the lateral direction does not take place. To connect the printed circuit board 11 (PCB) to the cooling body 19, a thermally conductive adhesive 18 is used.

An effect of such a design of an electronic assembly 10 for lighting applications is therefore the low heat dissipation in the lateral direction of the printed circuit board 11 and hence heat concentration in the region of the heat-generating components, e.g. in the region of the light emitting diode elements 14, 15, 16.

Various embodiments provide an electronic assembly for lighting applications, a lighting device and a method for producing an electronic assembly for lighting applications that makes improved heat dissipation possible.

An electronic assembly for lighting applications according to various embodiments includes a printed circuit board having a first printed circuit board surface, which is designed for populating with electronic components, and a second printed circuit board surface opposite the first printed circuit board surface. The printed circuit board has a continuous cutout from the first printed circuit board surface to the second printed circuit board surface. In this case, a continuous cutout is intended to be understood as an aperture from the first printed circuit board surface to the second printed circuit board surface. In various embodiments, said cutout may in this case be an inner cutout, which is delimited in the lateral direction by a closed frame formed by the printed circuit board. For example, the cutout may have a circular shape, an elliptical shape or a rectangular shape, e.g. with rounded corners.

The electronic assembly furthermore includes a heat distributor having at least one first contact surface and at least one second contact surface opposite the first contact surface. The first contact surface is connected in a material-bonded manner to the printed circuit board arranged in parallel therewith at the second printed circuit board surface. The heat distributor that is preferably of plate-shaped design can, for example, be stamped from sheet metal.

An electronic assembly according to various embodiments furthermore includes at least one first light emitting diode element, which is arranged on a section of the first contact surface, which section is exposed within the cutout, and is connected in a material-bonded manner to the first contact surface. The material-bonded connection between the at least one first light emitting diode element and the heat distributor can be effected by soldering or adhesive bonding. By way of a direct material-bonded connection of the at least one first light emitting diode element to the heat distributor, it is possible to achieve immediate dissipation of the arising heat in the lateral direction of the printed circuit board without heat having to be transported through the printed circuit board itself beforehand. Since the power of the heat distributor can be dimensioned independently of the printed circuit board and there is therefore no adherence to the restrictions specified by the production of the printed circuit boards, for example a maximum thickness for the application of copper to the bottom layer of the printed circuit board, the transport of heat in the lateral direction can be set here virtually as desired.

According to various embodiments, the heat distributor is of segmented form, wherein the heat distributor includes at least one first heat distribution segment having the first contact surface and the second contact surface and a second heat distribution segment having a third contact surface and a fourth contact surface opposite the third contact surface. In this case, a second light emitting diode element is arranged on a section of the third contact surface, which section is exposed within the same cutout or a further cutout of the printed circuit board, in a manner connected to the third contact surface in a material-bonded manner. Different light emitting diode elements can therefore respectively be arranged in a separate cutout or a group of light emitting diode elements can be arranged in a common cutout of the printed circuit board. The arrangement may depend here substantially on the density of the placement of the different light emitting diode elements.

The part of the first contact surface belonging to the first heat distribution segment may be situated in a common plane with the part of the first contact surface belonging to the second heat distribution segment. In a corresponding manner, the part of the second contact surface belonging to the first heat distribution segment may be situated in a common plane with the part of the second contact surface belonging to the second heat distribution segment. In other words, the first heat distribution segment and the second heat distribution segment form a plate-shaped heat distributor in the position as they are arranged in a manner connected to the printed circuit board in a material-bonded manner, which plate-shaped heat distributor is interrupted by a gap between the first heat distribution segment and the second heat distribution segment. A segmented heat distributor can thus be stamped from a cohesive piece of sheet metal in a particularly simple way.

According to various embodiments, the first heat distribution segment is electrically conductively connected via at least one bonding wire to a terminal of the second light emitting diode element, which terminal is not electrically conductively connected directly to the second heat distribution segment. A bonding wire is to be understood here as meaning a wire, e.g. a thin wire, which is used to connect the terminals of an integrated circuit or a discrete semiconductor—for example a transistor, a light emitting diode or a photodiode—to the electrical terminals of other components or of a housing. In contrast to the wire bonding, the process of soldering the rear-side contacts of a chip without a wire is referred to as chip bonding. According to various embodiments, both variants of bonding are preferably combined in a respective light emitting diode element (LED chip). As a result thereof, a series circuit composed of a plurality of light emitting diode elements can be realized in a particularly simple way by means of segmented heat distributors.

According to various embodiments, the spacing between the first heat distribution segment at the location of the placement of the first light emitting diode element and the second heat distribution segment at the location of the placement of the second light emitting diode element is lower than at the edge of the outer contour of the segmented heat distributor. In various embodiments, the spacing between the first heat distribution segment at the location of the placement of the first light emitting diode element and the second heat distribution segment at the location of the placement of the second light emitting diode element can increase continuously and/or in steps proceeding from the location of the placement of the first light emitting diode element and of the second light emitting diode element, respectively, toward the outer contour. On the one hand, close populating with light emitting diode elements can be achieved and, on the other hand, the outlay for a stamping process for producing the heat distribution segments can be kept within limits.

According to various embodiments, the heat distributor is electrically conductively connected to the printed circuit board via at least one bonding wire. This dispenses with the need to produce an electrically conductive connection between the heat distributor and the printed circuit board via the material-bonded connection in order for the light emitting diode elements arranged on the heat distributor or the light emitting diode element arranged on the heat distributor to be thus brought into electrical contact with the printed circuit board. As a result thereof, an electrically non-conductive adhesive can also be used, for example, for the material-bonded connection of the heat distributor to the printed circuit board.

There may be provision for the heat distributor to have a thickness determined by the spacing between the first contact surface and the second contact surface of between 175 micrometers and 700 micrometers. The same applies accordingly in the case of segmentation of the heat distributor into separate heat distribution segments, in each case identically for the individual heat distribution segments.

In the order in which they are mentioned according to the following list, the thickness is at least 200 micrometers, 250 micrometers, 300 micrometers. This makes it possible to significantly increase the lateral transport of heat in comparison to the heat spreading that can be achieved using a copper support applied in conventional technology in the order of magnitude of 35 micrometers to 75 micrometers.

According to the following list, the thickness may be at most 700 micrometers, 600 micrometers, 500 micrometers. This ensures that the heat distributor can still be applied (laminated) onto the printed circuit board in a reliable manner.

According to various embodiments, the heat distributor is formed from a metal, preferably from silver, copper, gold or aluminum, in particular composed in multilayer fashion from one of the aforementioned materials. A surface coating including copper can be used here, for example, for good soldering properties; a gold coating can serve as corrosion protection.

The heat distributor can be stamped from sheet metal as an initially cohesive component and dismantled into individual heat distribution segments only in a subsequent manufacturing process. As a result thereof, the spacings provided between individual heat distribution segments can be retained in a particularly reliable manner. In various embodiments, in electronic assemblies manufactured in a multiple panel, the heat distributor can also be stamped from a piece in cohesive fashion according to the panel design so that the entire populated multiple panel can be joined together with a single heat distributor frame. Said joining together can take place, for example, in one single production process.

According to various embodiments, the second contact surface is connected in a material-bonded manner to a heatsink by means of a thermally conductive connecting means. A heatsink of this kind can be designed, for example, in the form of a cooling body, which is equipped with cooling ribs and/or cooling fingers, for example, to dissipate the heat from the electronic assembly to the surroundings of the electronic assembly, for example to the surrounding air. In high-power applications, the use of a heat pipe is also conceivable.

According to various embodiments, the thermally conductive connecting means is electrically insulating. This may result in the effect that a cooling body can be connected in a potential-free manner, as a result of which good heat dissipation can nevertheless be achieved over an extensive contact connection compared to metal-filled and hence electrically conductive adhesives.

According to various embodiments, the outer contour of the printed circuit board is substantially congruent with the outer contour of the heat distributor. As a result thereof, the transmission of heat to the heatsink arranged on the rear side of the electronic assembly can be optimized. This likewise holds true for a heat distributor possibly embodied in segmented form and composed of a plurality of heat distribution segments.

According to various embodiments, the heat distributor is adhesively bonded and/or at least partially soldered to the printed circuit board in planar fashion. In this case, the connecting technique respectively to be selected can be determined depending on the material thickness of the heat distributor. For example, in the case of a thickness of the heat distributor in the lower preferred range, planar adhesive bonding can be carried out in a lamination process by means of a roller. For material thicknesses in the upper range of the exemplary values, partial soldering may be carried out.

According to various embodiments, the printed circuit board is produced as a single-layer printed circuit board having a copper support only on the first printed circuit board surface or as a multilayer printed circuit board having a copper support only on the first printed circuit board surface and on at least one inner layer arranged between the first printed circuit board surface and the second printed circuit board surface. As a result thereof, necessary plated-through holes, which were unavoidable in the routing of the circuit of the electronic assembly, can be realized without the risk of a short circuit via the heat distributor when the plated-through holes lead to an inner layer not as a complete plated-through hole but only as a partial plated-through hole.

This can also be provided in the case of double-layer printed circuit boards having a copper layer on the first printed circuit board surface and a copper layer on the second printed circuit board surface. Furthermore, continuous plated-through holes and/or conductor tracks can be realized on the bottom layer of the printed circuit board, that is to say the second printed circuit board surface, by virtue of said plated-through holes and/or conductor tracks being placed into a gap between the individual heat distribution segments when the heat distributor is of segmented form.

A lighting device may include an electronic assembly according to various embodiments, which results in a lighting device according to the invention. The lighting device may include a terminal element, which makes it possible to replace the electronic assembly. Said lighting device may be a lighting device in a or for a motor vehicle. The lighting device may include an optical waveguide, a reflector, a lens, a collimator or any desired combination of at least two of the aforementioned elements.

A further aspect of various embodiments relates to a method for producing an electronic assembly for lighting applications. The method includes providing a printed circuit board having a first printed circuit board surface, which is designed for populating with electronic components and/ or which is populated with electronic components, and a second printed circuit board surface opposite the first printed circuit board surface, wherein the printed circuit board has a continuous cutout from the first printed circuit board surface to the second printed circuit board surface. The method further includes connecting a heat distributor, which has at least one first contact surface and at least one second contact surface opposite the first contact surface, at the first contact surface in a material-bonded manner to the printed circuit board arranged in parallel therewith at the second printed circuit board surface. The method also includes arranging at least one first light emitting diode element on a section of the first contact surface, which section is exposed within the cutout, and connecting the at least one first light emitting diode element in a material-bonded manner to the first contact surface.

The effects and features as well as embodiments described for the electronic assembly according to various embodiments apply accordingly for a lighting device according to various embodiments having an electronic assembly and—as far as applicable—for the method according to various embodiments for producing an electronic assembly for lighting applications. Corresponding method features can therefore be provided for apparatus features and vice versa.

According to various embodiments of an electronic assembly 20, proceeding from a printed circuit board 11 that has already been completely populated with electronic components and is also referred to as PCB, a heat distributor 22 is laminated onto the bottom layer of the printed circuit board 11, namely onto a second printed circuit board surface 11b. Based on the designations commonly used for the design of an electronic semiconductor component, the heat distributor 22, which can also be present as a segmented heat distributor, namely like in the selected embodiment as the first heat distribution segment 221, as the second heat distribution segment 222 and as the third heat distribution segment 223, is referred to in the following text as a leadframe.

A leadframe (terminal frame) is a solderable metallic lead carrier in the form of a frame or comb for the mechanical production of semiconductor chips or other electronic component parts. The individual contacts (leads) are usually still connected to one another, wherein the frames of the individual products can likewise be connected to one another. The heat distributor 22, that is to say the leadframe, can be either adhesively bonded or partially soldered to the bottom layer of an FR4 printed circuit board, namely to the second printed circuit board surface 11b of the printed circuit board 11, in planar fashion. FR4 denotes a class of composite materials with low flammability and flame-retarding properties consisting of epoxy resin and glass fibers fabric. FR4 material is thus usually used as a high-grade base material for electronic circuits having a high thermal load. In the case of soldering, the printed circuit board 11 also requires a copper layer 13, which can be used for the soldering, on the bottom layer, that is to say on the second printed circuit board surface 11b.

In this case, the printed circuit board 11 may be processed in a multiple panel, in which a plurality of electronic assemblies 20 are initially constructed in cohesive fashion within a larger printed circuit board and are separated (isolated) from the panel only after completion of the respective electronic assembly 20. When using a manufacturing method of this kind, the heat distributor 22 can also be applied initially as a cohesive group of heat distributors 22, which are separated from one another only after the isolation of the individual electronic assemblies. The same applies in the segmentation of the heat distributor 22, in which the first heat distribution segment 221, the second heat distribution segment 222 and the third heat distribution segment 223 are stamped out of a copper plate in cohesive fashion and are separated from one another only after the isolation of the individual electronic assemblies 20. The multiple panel thus serves to combine printed circuit boards for the purpose of joint processing with respect to the structure/plated-through hole/surface.

Through the additional application of the heat distributor 22, the design of the printed circuit board can be configured in principle without or with a significantly reduced number of plated-through holes (vias), which are used only for thermal purposes, namely for better heat dissipation.

In terms of construction, the thickness of the plate-shaped heat distributor 22 is dimensioned to be approximately five to ten times thicker than the copper layer thickness of a conventional FR4 printed circuit board, which is usually 35 micrometers or 70 micrometers.

The printed circuit board 11 has a cutout 21 at the location at which the light emitting diodes including a first light emitting diode element 14, a second light emitting diode element 15 and a third light emitting diode element 16 are intended to be populated. The light emitting diodes are soldered directly onto the heat distributor 22 through the cutout 21.

Figure 4:
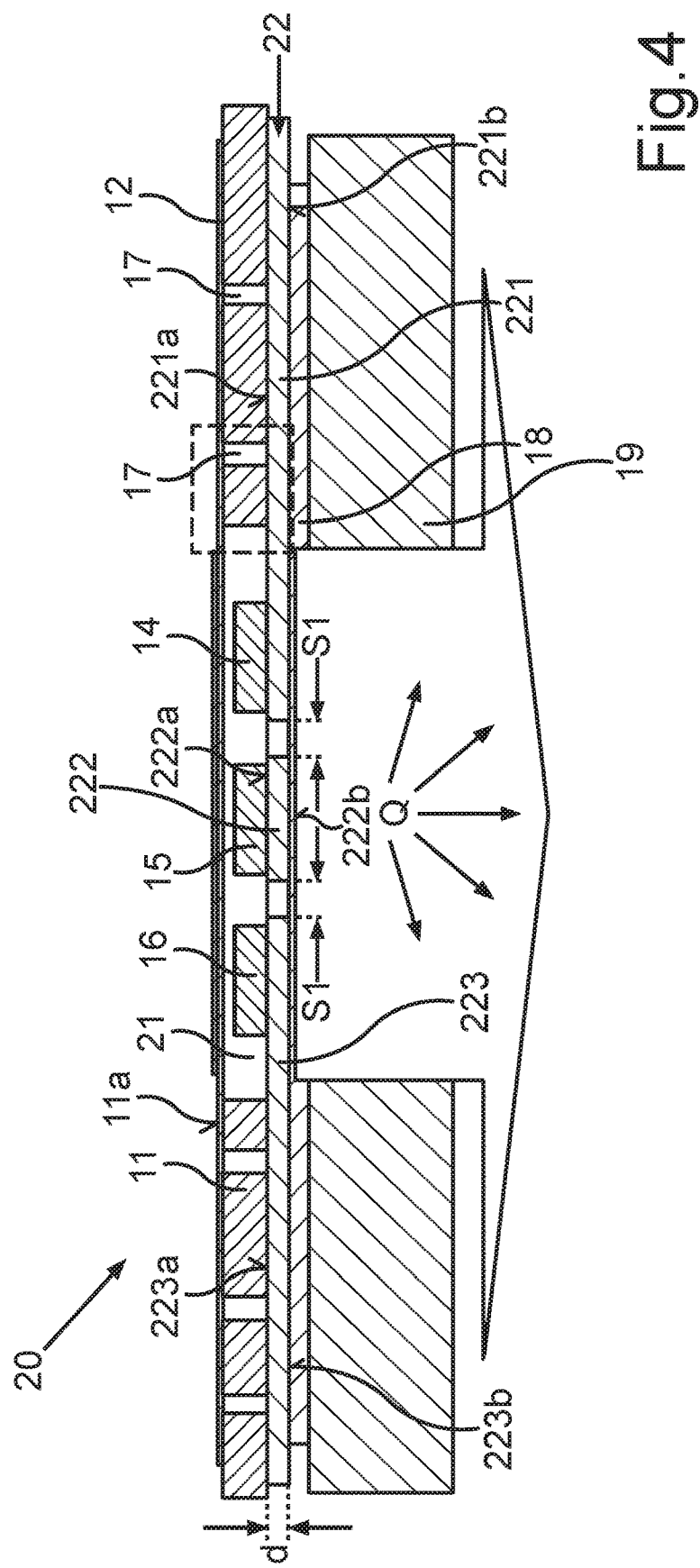
FIG. 4 shows a simplified schematic illustration of a sectional view of a preferred embodiment of an electronic assembly 20 according to various embodiments.

The function of the heat distributor 22 is substantially restricted to the thermal spreading of the heat losses, denoted as Q in FIG. 4, and the dissipation of the heat losses Q of the light emitting diode elements 14, 15, 16. The heat distributor 22 as leadframe also electronically takes over the function of generating a series circuit of the light emitting diode elements 14, 15, 16 by virtue of the fact that in each case a bond is produced from an electrical N terminal of the respective light emitting diode element to an electrical P terminal of a respective adjacent light emitting diode element via wire-bonding connections.

As illustrated in FIG. 4, the printed circuit board 11 is adhesively bonded together with the heat distributor 22 as part of the electronic assembly 20 onto a cooling body 19, which serves as a heatsink, by means of a thermally conductive adhesive 18. In this case, the thermally conductive adhesive 18 is embodied to be electrically non-conductive and serves simultaneously as an electrical insulator between the individual leadframe segments, namely the first heat distribution segment 221, the second heat distribution segment 222 and the third heat distribution segment 223.

This design can significantly improve the thermal spreading of the heat losses Q generated by the first light emitting diode element 14, the second light emitting diode element 15 and the third light emitting diode element 16. While the dissipation of the heat losses Q is effected mainly in the vertical direction in a known design according to FIG. 1 to FIG. 3, that is to say starting from the first light emitting diode element 14, the second light emitting diode element 15 and the third light emitting diode element 16 through the printed circuit board 11 and then through the adhesive 18 into the cooling body 19, in the design according to various embodiments, a not insignificant dissipation of the heat losses is also effected in the lateral direction by way of the interconnected heat distributor 22, which is indicated in FIG. 4 by the additional arrows.

A first comparative thermal simulation that has been carried out by the inventors has shown an overall improvement of 8.4 kelvins, which can be rated as significant and relevant given the greatly restricted installation space available for an electronic assembly 20 for lighting applications.

Figure 6:
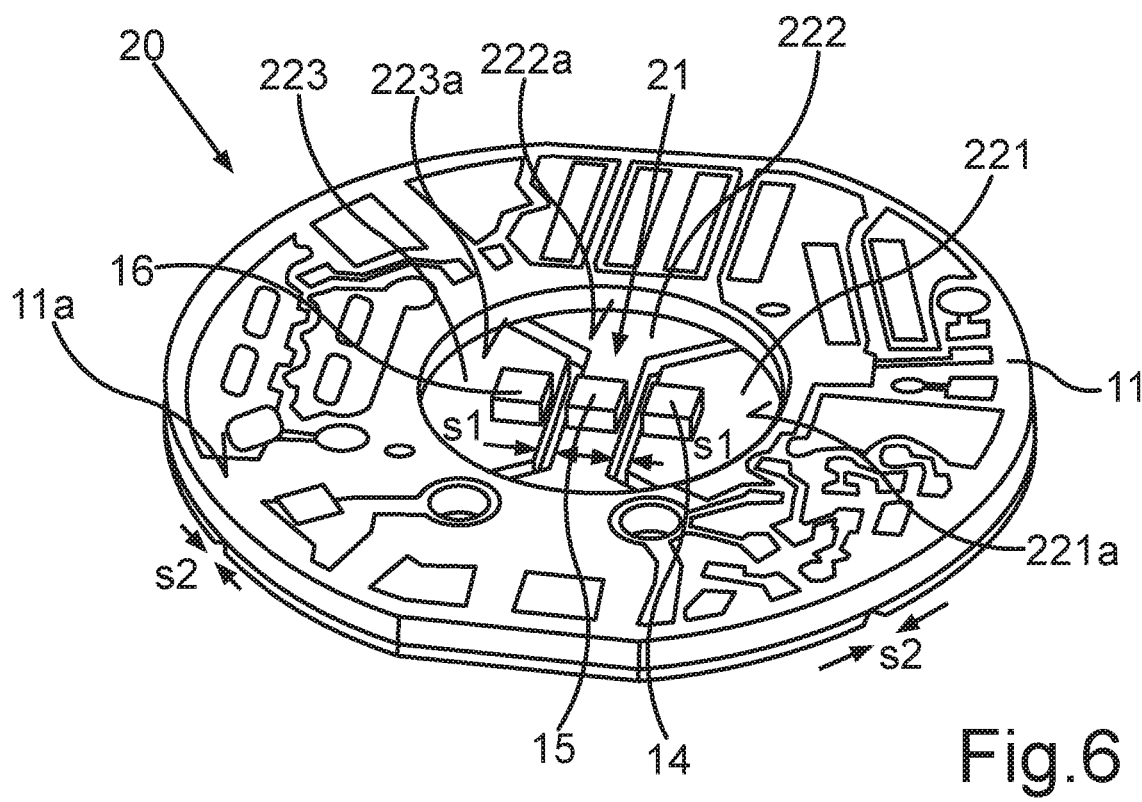
FIG. 6 shows a simplified schematic illustration of a perspective view of a printed circuit board having a segmented heat distributor arranged on the bottom layer of the printed circuit board from the electronic assembly as illustrated in FIG. 4.
Figure 7:
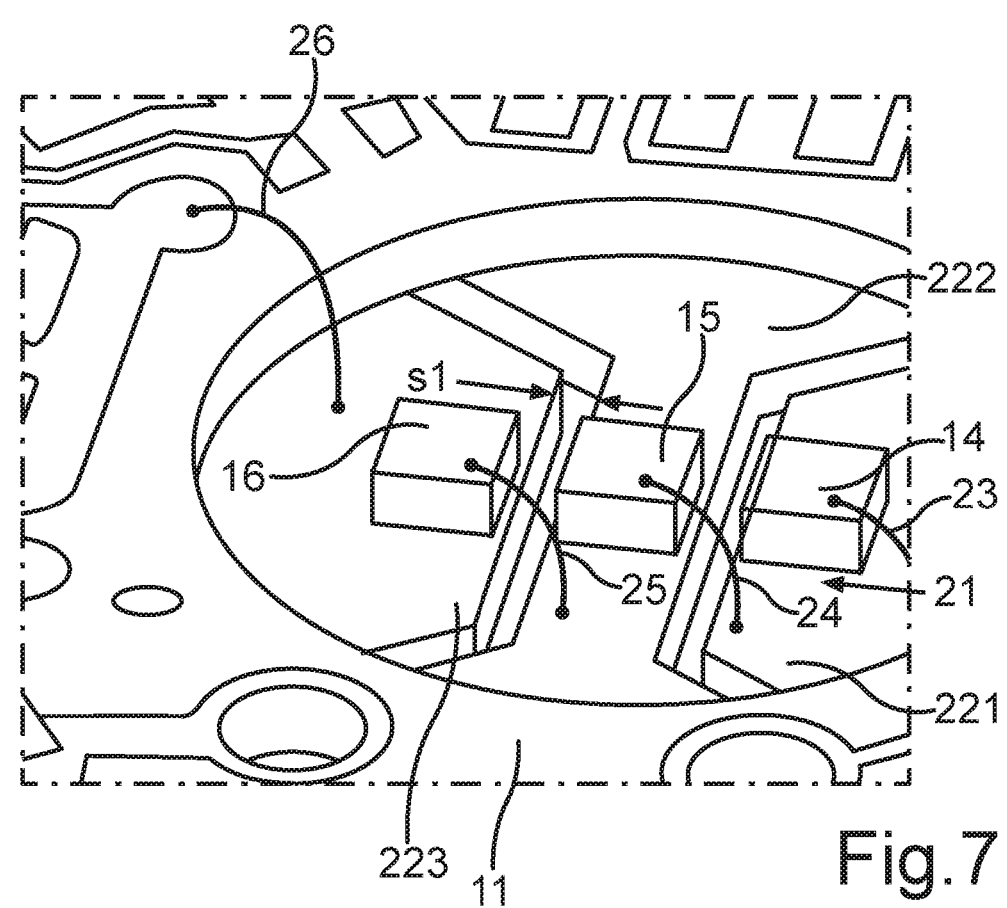
FIG. 7 shows a simplified schematic illustration of a more detailed enlarged illustration of a section from the illustration of FIG. 6.

Specifically in electronic assemblies 20 for LED lighting devices, which have to be designed in a compact manner for reasons of design technology, for example, the round design of the printed circuit board 11 illustrated in FIG. 6 and FIG. 7 may be provided. Here, the cutout 21 is arranged centrally as a circular section within the printed circuit board 11. The light emitting diode elements 14 to 16 are thus also arranged centrally within the electronic assembly 10 and are placed in a tight space with respect to one another for reasons of lighting technology. The light emitting diode elements 14, 15, 16 therefore represent a thermal concentration point (hotspot) as can be seen from the illustration in FIG. 6.

Since in this case the first light emitting diode element 14 is soldered directly onto the first heat distribution segment 221, the second light emitting diode element 15 is soldered directly onto the second heat distribution segment 222 and the third light emitting diode element 16 is soldered directly onto the third heat distribution segment 223, significantly better heat dissipation properties are produced on account of the high specific thermal conductivity of copper, which serves as the material of the heat distributor 22, and of a suitable selection of the material thickness d of the heat distributor 22.

Figure 5:
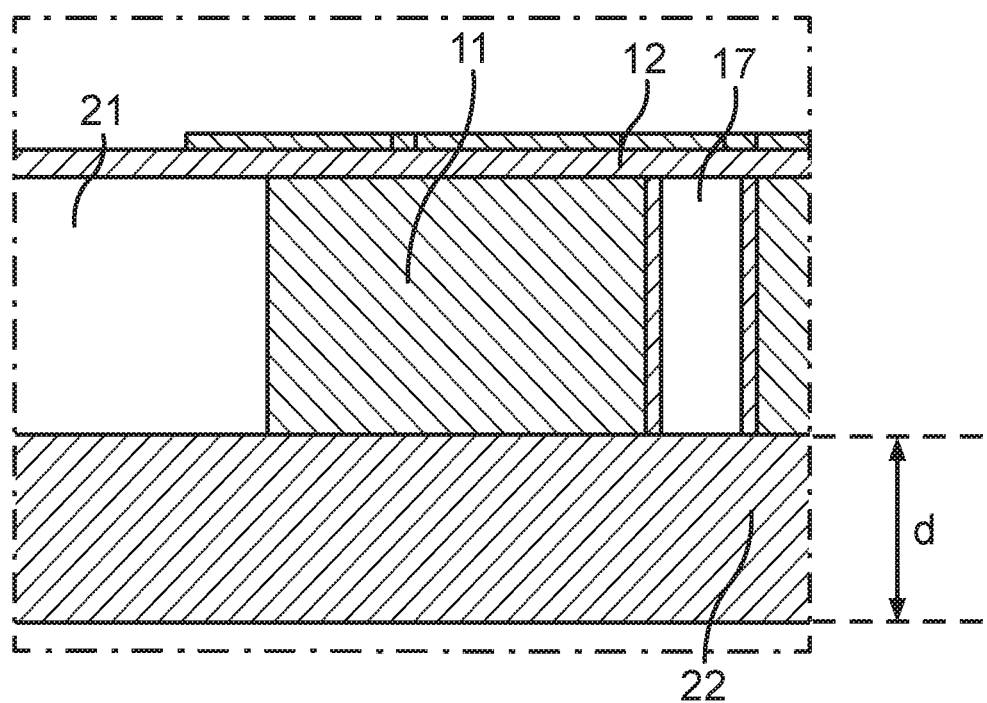
FIG. 5 shows a simplified schematic illustration of an enlarged detail view of a section from FIG. 4.

As already basically illustrated above and as can be seen in FIG. 4 to FIG. 6, the electronic assembly 20 includes a printed circuit board 11 having a first printed circuit board surface 11a on the top layer of the printed circuit board 11 and a second printed circuit board surface 11b on the bottom layer of the printed circuit board 11. A first copper layer 12 is further arranged on the top layer of the printed circuit board 11, said first copper layer serving for producing the electrical connection between the components to be placed on the first printed circuit board surface 11a, that is to say on the top layer of the printed circuit board 11. A second copper layer 13 can optionally be provided on the second printed circuit board surface 11b.

The first heat distribution segment 221 has a first contact surface 221a by means of which said segment is connected in a material-bonded manner to a corresponding part of the second printed circuit board surface 11b provided the first contact surface 221a is not located within the cutout 21. The first light emitting diode element 14 is arranged on the part of the first contact surface 221a that is exposed within the cutout 21.

In a corresponding manner, the second heat distribution segment 222 has a third contact surface 222a, wherein the third contact surface 222a is connected in a material-bonded manner to the second printed circuit board surface 11b in a manner already known. The second light emitting diode element 15 is arranged within the cutout 21 on the exposed part of the third contact surface 222a.

In a manner analogous thereto, the third heat distribution segment 223 has a fifth contact surface 223a, which is connected in a material-bonded manner to a corresponding part of the second printed circuit board surface 11b. The third light emitting diode element 16 is arranged within the cutout 21 on the fifth contact surface 223a.

The first contact surface 221a, the third contact surface 222a and the fifth contact surface 223a therefore each represent a top layer of the respective heat distribution segment 221, 222, 223; the respective bottom layers of the heat distribution segments 221, 222, 223 are referred to as second contact surface 221b, as fourth contact surface 222b and as sixth contact surface 223b. The spacing between the first contact surface 221a and the second contact surface 221b is in this case given by a thickness d just like the spacing of the third contact surface 222a and the fourth contact surface 222b and also the fifth contact surface 223a and the sixth contact surface 223b. In the embodiments selected, said thickness may be 0.5 millimeters (500 micrometers); e.g. a range for the thickness d may be 0.3 millimeters to 0.7 millimeters. The printed circuit board 11 itself can have a thickness of between 1 millimeter and 1.5 millimeters, which corresponds to the spacing between the first printed circuit board surface 11a and the second printed circuit board surface 11b.

FIG. 7 depicts an enlarged illustration of a section from the electronic assembly according to the illustration of FIG. 6, wherein additional details are added. The additionally added details relate here to an electrical connection of the component parts among one another using the connecting technique of wire bonding.

A first bonding wire 23, which is electrically conductively contact-connected to a terminal on the top layer of the first light emitting diode element 14, connects the first light emitting diode element 14 to an associated terminal of the printed circuit board 11, said terminal not being shown in any more detail in FIG. 7. The first light emitting diode element 14 is soldered onto the first heat distribution segment 221. Said process of soldering of the rear-side contacts of a chip without a wire is, in contrast to wire bonding, referred to as chip bonding. In connection with various embodiments, both methods may therefore be combined with one another.

The first heat distribution segment 221 is electrically conductively connected to a terminal on the top layer of the second light emitting diode element 15 by way of a second bonding wire 24. As already illustrated above, the second light emitting diode element 15 is soldered onto the second heat distribution segment 222. The second heat distribution segment 222 is further electrically conductively connected to a terminal on the top layer of the third light emitting diode element 16 by way of a third bonding wire 25. The third light emitting diode element 16 for its part is in turn soldered to a rear-side contact on the third heat distribution segment 223.

Finally, the third heat distribution segment 223 is connected to a corresponding terminal on the printed circuit board 11, namely on the first printed circuit board surface 11a, the top layer of the printed circuit board 11, by way of a fourth bonding wire 26. A series circuit of the first light emitting diode element 14, the second light emitting diode element 15 and the third light emitting diode element 16 is thus realized by means of the circuitry illustrated.

FIG. 7 thus shows the essential main electronic connections between the printed circuit board 11 and the leadframe used as the heat distributor 22. These connections can be realized by means of a wire bonding or a ribbon bonding method.

At the location of the placement of the first light emitting diode element 14 and the second light emitting diode element 15, the first heat distribution segment 221 and the second heat distribution segment 222 have a spacing with respect to one another that is signified by an inner gap width s1. In a corresponding manner, the spacing between the second heat distribution segment 222 and the third heat distribution segment 223 at the location of the placement of the second light emitting diode element 15 and the third light emitting diode element 16 is signified by the inner gap width s1. This spacing of the heat distribution segments with respect to one another can be kept constant over the entire profile of the gap up to the circular outer contour, as illustrated in FIG. 6 and FIG. 7, as a result of which an outer gap width s2 equal to the inner gap width s1 is produced at the outer contour. As an alternative, there may be provision for the inner gap width s1 to be smaller than the outer gap width s2, e.g. for the inner gap width s1 to represent the minimum value of the gap width over the entire profile thereof, whereas the outer gap width s2 represents the maximum value of the gap width over the entire profile of the gap between the respective heat distribution segments.

The inner gap width s1 in the leadframe between the light emitting diode elements 14, 15, 16 can thus be configured to be smaller than the outer gap width s2 in the region of the rest of the leadframe in order to be able to realize close populating in this region and at the same time to keep the complexity for the stamping process low in the other regions.

Using the design according to various embodiments, on the one hand, separation of the functions thermal spreading and heat dissipation and, on the other hand, the provision of the electronic circuit—except for the series circuit formed by the first light emitting diode element 14, the second light emitting diode element 15 and the third light emitting diode element 16—is thus realized, with the result that the printed circuit board 11 itself does not influence the removal of heat from the high-loss light emitting diode elements 14, 15, 16. A reduction in the complexity of the printed circuit board 11 can therefore be achieved by dispensing with the thermal plated-through holes (vias). One or more electrical connections can be realized between the leadframe and the printed circuit board 11 (PCB), e.g. by using a wire bonding connecting technique.

According to various embodiments illustrated, the adhesive 18 between the arrangement, composed of the printed circuit board 11 and the segmented heat distributor 22, referred to as the leadframe hybrid and the cooling body 19 used as a heatsink is formed as an electrical insulator.

The embodiments serve merely for explanation of the invention and is not restrictive therefor. In various embodiments, the specific configuration of the heat distribution segments 221, 222, 223 and a variation of the number thereof as well as the arrangement of the light emitting diode elements 14, 15, 16 and a variation of the number thereof and also the type and number of cutout(s) 21 can be formed as desired without departing from the concept of the invention.

The above has therefore shown how a specific printed circuit board design can be used to optimize the thermal performance of an LED light module by means of targeted division of the basic functions of an electronic circuit and thermal layout as a so-called leadframe hybrid.

LIST OF REFERENCE SIGNS

10 Electronic assembly
11 Printed circuit board
11a First printed circuit board surface
11b Second printed circuit board surface
12 First copper layer
13 Second copper layer
14 First light emitting diode element
15 Second light emitting diode element
16 Third light emitting diode element
17 Plated-through hole (via)
18 Adhesive (thermally conductive adhesive)
19 Cooling body (heatsink)
20 Electronic assembly
21 Cutout (aperture)
22 Heat distributor (leadframe)
221 First heat distribution segment
222 Second heat distribution segment
223 Third heat distribution segment
221a First contact surface
221b Second contact surface
222a Third contact surface
222b Fourth contact surface
223a Fifth contact surface
223b Sixth contact surface
23 First bonding wire
24 Second bonding wire
25 Third bonding wire
26 Fourth bonding wire
d Thickness
Q Heat dissipation
s1 Inner gap width
s2 Outer gap width While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An electronic assembly for lighting applications, the electronic assembly comprising:
a printed circuit board having a first printed circuit board surface, which is designed for populating with electronic components, and a second printed circuit board surface opposite the first printed circuit board surface, wherein the printed circuit board has a continuous cutout from the first printed circuit board surface to the second printed circuit board surface;
a heat distributor having at least one first contact surface and at least one second contact surface opposite the first contact surface, wherein the first contact surface is connected in a material-bonded manner to the printed circuit board arranged in parallel therewith at the second printed circuit board surface; and
at least one first light emitting diode element, which is arranged on a section of the first contact surface, which section is exposed within the cutout, and is connected in a material-bonded manner to the first contact surface;
wherein the heat distributor is of segmented form, comprising at least one first heat distribution segment having the first contact surface and the second contact surface and a second heat distribution segment having a third contact surface and a fourth contact surface opposite the third contact surface, a spacing provided between the first heat distribution segment and the second heat distribution segment;
wherein a second light emitting diode element is arranged on a section of the third contact surface, which section is exposed within the same cutout or a further cutout of the printed circuit board, and connected to the third contact surface in a material-bonded manner.

2. The electronic assembly of claim 1,
wherein the first heat distribution segment is electrically conductively connected via at least one bonding wire to a terminal of the second light emitting diode element, which terminal is not electrically conductively connected directly to the second heat distribution segment.

3. The electronic assembly of claim 1,
wherein the spacing between the first heat distribution segment at the location of the placement of the first light emitting diode element and the second heat distribution segment at the location of the placement of the second light emitting diode element is lower than an edge of the outer contour of the segmented heat distributor.

4. The electronic assembly of claim 1,
wherein the heat distributor is electrically conductively connected to the printed circuit board via at least one bonding wire.

5. The electronic assembly of claim 1,
wherein the heat distributor has a thickness determined by the spacing between the first contact surface and the second contact surface in the range from 175 micrometers to 700 micrometers.

6. The electronic assembly of claim 1,
wherein the heat distributor is formed from a metal.

7. The electronic assembly of claim 6,
wherein the heat distributor is formed at least one of a group consisting of silver, copper, gold, and aluminum.

8. The electronic assembly of claim 6,
wherein the heat distributor is formed in multilayer fashion.

9. The electronic assembly of claim 1,
wherein the second contact surface is connected in a material-bonded manner to a heatsink by means of a thermally conductive connecting means.

10. The electronic assembly of claim 9,
wherein the thermally conductive connecting means is electrically insulating.

11. The electronic assembly of claim 1,
wherein the outer contour of the printed circuit board is substantially congruent with the outer contour of the heat distributor.

12. The electronic assembly of claim 1,
wherein the heat distributor is at least one of adhesively bonded or at least partially soldered to the printed circuit board in planar fashion.

13. The electronic assembly of claim 1,
wherein the printed circuit board is produced as a single-layer printed circuit board having a copper support only on the first printed circuit board surface or as a multi-layer printed circuit board having a copper support only on the first printed circuit board surface and on at least one inner layer arranged between the first printed circuit board surface and the second printed circuit board surface.

14. A lighting device comprising an electronic assembly, the electronic assembly comprising:
a printed circuit board having a first printed circuit board surface, which is designed for populating with electronic components, and a second printed circuit board surface opposite the first printed circuit board surface, wherein the printed circuit board has a continuous cutout from the first printed circuit board surface to the second printed circuit board surface;
a heat distributor having at least one first contact surface and at least one second contact surface opposite the first contact surface, wherein the first contact surface is connected in a material-bonded manner to the printed circuit board arranged in parallel therewith at the second printed circuit board surface; and
at least one first light emitting diode element, which is arranged on a section of the first contact surface, which section is exposed within the cutout, and is connected in a material-bonded manner to the first contact surface;
wherein the heat distributor is of segmented form, comprising at least one first heat distribution segment having the first contact surface and the second contact surface and a second heat distribution segment having a third contact surface and a fourth contact surface opposite the third contact surface;
wherein a second light emitting diode element is arranged on a section of the third contact surface, which section is exposed within the same cutout or a further cutout of the printed circuit board, and connected to the third contact surface in a material-bonded manner.

15. A method for producing an electronic assembly for lighting applications, the method comprising:
providing a printed circuit board having a first printed circuit board surface, which at least one of is designed for populating with electronic components or is populated with electronic components, and a second printed circuit board surface opposite the first printed circuit board surface, wherein the printed circuit board has a continuous cutout from the first printed circuit board surface to the second printed circuit board surface;

connecting a heat distributor, which has at least one first contact surface and at least one second contact surface opposite the first contact surface, at the first contact surface in a material-bonded manner to the printed circuit board arranged in parallel therewith at the second printed circuit board surface;

arranging at least one first light emitting diode element on a section of the first contact surface, which section is exposed within the cutout; and connecting the at least one first light emitting diode element in a material-bonded manner to the first contact surface;

providing the heat distributor in segmented form, comprising at least one first heat distribution segment having the first contact surface and the second contact surface and a second heat distribution segment having a third contact surface and a fourth contact surface opposite the third contact surface;

arranging a second light emitting diode element on a section of the third contact surface, which section is exposed within the same cutout or a further cutout of the printed circuit board, and connected to the third contact surface in a material-bonded manner.

* * * * *